United States Patent
Ko et al.

(10) Patent No.: US 8,120,067 B1
(45) Date of Patent: Feb. 21, 2012

(54) POWER AND GROUND ROUTING OF INTEGRATED CIRCUIT DEVICES WITH IMPROVED IR DROP AND CHIP PERFORMANCE

(75) Inventors: Ching-Chung Ko, Hsinchu County (TW); Tao Cheng, Hsinchu (TW); Tien-Yueh Liu, Hsinchu (TW); Dar-Shii Chou, New Taipei (TW); Peng-Cheng Kao, Hsinchu (TW)

(73) Assignee: Mediatek Inc., Science-Based Industrial Park, Hsin-Chu (TW)

( * ) Notice: Subject to any disclaimer, the term of this patent is extended or adjusted under 35 U.S.C. 154(b) by 0 days.

(21) Appl. No.: 13/281,458

(22) Filed: Oct. 26, 2011

Related U.S. Application Data

(63) Continuation of application No. 12/883,163, filed on Sep. 15, 2010, now Pat. No. 8,072,004, which is a continuation of application No. 12/052,735, filed on Mar. 21, 2008, now Pat. No. 7,821,038.

(51) Int. Cl.
*H01L 27/10* (2006.01)

(52) U.S. Cl. ........ 257/207; 257/758; 257/759; 257/762; 257/765; 257/E27.07

(58) Field of Classification Search .................. 257/207, 257/758, 759, 762, 765, E27.07
See application file for complete search history.

(56) References Cited

U.S. PATENT DOCUMENTS

| | | | |
|---|---|---|---|
| 6,551,856 B1 | 4/2003 | Lee | |
| 6,717,270 B1 | 4/2004 | Downey | |
| 6,835,642 B2 | 12/2004 | Yang | |
| 6,900,541 B1 | 5/2005 | Wang | |
| 7,271,489 B2 * | 9/2007 | Lin et al. | 257/773 |
| 7,304,385 B2 * | 12/2007 | Wang et al. | 257/758 |
| 2002/0190390 A1 | 12/2002 | Lu | |
| 2005/0202221 A1 | 9/2005 | Wang | |
| 2006/0163734 A1 | 7/2006 | Thei | |
| 2007/0176292 A1 | 8/2007 | Chen | |

* cited by examiner

*Primary Examiner* — Andy Huynh
(74) *Attorney, Agent, or Firm* — Winston Hsu; Scott Margo

(57) ABSTRACT

An integrated circuit chip includes a semiconductor substrate having thereon a plurality of IMD layers and first conductive layers embedded in the IMD layers; a first insulating layer overlying the IMD layers and the first conductive layers; a plurality of first power/ground mesh wiring lines, in a second conductive layer overlying the first insulating layer, for distributing power signal or ground signal; and a second insulating layer covering the second conductive layer and the first insulating layer.

9 Claims, 4 Drawing Sheets

POWER AND GROUND ROUTING OF INTEGRATED CIRCUIT DEVICES WITH IMPROVED IR DROP AND CHIP PERFORMANCE

CROSS REFERENCE TO RELATED APPLICATIONS

This is a continuation application of U.S. patent application Ser. No. 12/883,163 filed Sep. 15, 2010, which itself is a continuation application of U.S. patent application Ser. No. 12/052,735 filed Mar. 21, 2008, now U.S. Pat. No. 7,821,038.

BACKGROUND OF THE INVENTION

1. Field of the Invention

The invention relates generally to the integrated circuit power and ground routing and, more particularly, to a novel power and ground routing of integrated circuit (IC) chip devices that utilizes aluminum layer to form power or ground lines for distributing power across the IC from an off chip source to various blocks within the IC, thereby reducing the IR drop (or voltage drop) of the integrated circuit chip devices and improving the chip performance.

2. Description of the Prior Art

In the processes for designing a large-scale integrated semiconductor circuit device, respective blocks of the device are generally designed in parallel to complement device characteristics with one another. During the designing the large-scale device, the building-block type of method is utilized, in which the circuit of the device is divided into a plurality of circuit blocks and each of the circuit blocks is thus designed at the same time. The overall design of the device is then carried out by integrating these constituent blocks.

An integrated circuit (IC) usually has a larger number of circuit blocks and multiple levels of conductors are used to distribute power and signals from off the IC to the circuit blocks within the IC, between the circuit blocks, and between cells within each circuit block.

The conductors are formed by lithographically patterning a layer of conductive material to form conductive lines as viewed from above the IC substrate. The conductive layers with conductive lines formed therein are isolated by an insulating layer so that lines of one layer which cross another layer do not physically or electrically contact each other. When it is desired to electrically connect a conductive line formed in one layer to a conductive line formed in another layer, a conductive via is formed extending through the insulating layer between the two conductors.

The conductive layers typically have different sheet resistances, with the lowest level (layer 1 or M1) having the highest sheet resistance and the highest level having the lowest sheet resistance. This is due to technological processing constraints such as smaller thickness at the lower layers. The different sheet resistances have influenced routing, for example, with the higher sheet resistance, lower layers generally being used to make connections which are relatively close (e.g. within cells or blocks) while the higher level, lower sheet resistance layers are used to make longer connections, such as between points in different blocks.

FIG. 1 is an enlarged top view of a conventional IC chip device with six levels of copper metal layers, wherein merely a small part of a particular circuit block of the IC chip device is illustrated for the sake of simplicity. As shown in FIG. 1, a circuit block 10 has power ($V_{DD}$) ring 12 and ground ($V_{SS}$) ring 14 disposed along its perimeter. The power ring 12 and ground ring 14 are either formed in the sixth-level metal layer (hereinafter M6) or the copper metal layer that is one level lower than M6, i.e., M5. By way of example, the power ring 12 is formed in M6, while the ground ring 14 is formed in M5. In such case, some of the other lower levels of copper metal layers, for example, from the second-level copper metal layer, i.e., M2, to the fourth-level copper metal layer, i.e., M4, may be used for signal routing.

Within a center region of the circuit block 10 that is surrounded by the power ring and ground ring, a so-called "mesh" interconnection network 20 is provided. The mesh interconnection network 20 consists of a plurality of substantially orthogonal horizontal lines 22 and longitudinal lines 24. Through the mesh interconnection network 20 and respective via stacks 32 and 34, the power or ground signals are provided from respective power or ground rings to the cell level devices such as transistors or regions which are fabricated in or on the main surface of the semiconductor substrate (not shown) and are not equally spaced from the ring. The horizontal lines 22 and longitudinal lines 24 of the mesh interconnection network 20 are respectively formed in either M5 or M6 in this exemplary case.

In addition, in current copper processes, a layer of aluminum disposed under a passivation layer is mainly used to provide a bondable interface, an aluminum bond pad, atop a copper bond pad formed in the topmost copper metal layer of the integrated circuit chip in order to prevent oxidation of the underlying copper bond pad. In some cases, the layer of aluminum disposed under the passivation layer may be used to form so-called re-distributed layer (RDL) to re-distribute the aluminum bond pad to other location primarily for flip-chip applications.

The prior art approach of using the topmost two levels of the copper metal layers, i.e., M5 and M6, for power and ground routing induces that the voltage drop (or IR drop) is unavoidably high. This is partly due to that M5 and M6 have different thicknesses and different sheet resistances (Rs). Typically, M5 is much thinner than M6, and thus has a higher sheet resistance (roughly about two times of the sheet resistance of M6).

Therefore, there is a strong need in this industry to provide an improved power and ground routing for the integrated circuit chip devices that is capable of reducing the IR drop, thus improving the chip performance.

SUMMARY OF THE INVENTION

It is one object of the invention to provide an improved power and ground routing for the integrated circuit chip devices that is capable of reducing the IR drop and improving the chip performance.

It is another object of the invention to provide an integrated circuit chip device that utilizes aluminum layer over passivation to form power or ground lines, thereby reducing the IR drop of the integrated circuit chip device and improving the performance thereof.

According to the claimed invention, an integrated circuit chip includes a semiconductor substrate having thereon a plurality of inter-metal dielectric (IMD) layers and a plurality of first conductive layers embedded in respective the plurality of IMD layers, wherein the first conductive layers comprise copper; a first passivation layer overlying the plurality of IMD layers and the plurality of first conductive layers; a plurality of first power/ground mesh wiring lines, formed in a second conductive layer overlying the first passivation layer, for distributing power signal or ground signal, wherein the second conductive layer comprise aluminum; and a second passivation layer covering the second conductive layer and the first passivation layer.

From one aspect of this invention, an integrated circuit chip includes a semiconductor substrate having thereon a plurality of inter-metal dielectric (IMD) layers and a plurality of first conductive layers embedded in respective the plurality of IMD layers, wherein the first conductive layers comprise copper; a first passivation layer overlying the plurality of IMD layers and the plurality of first conductive layers; a first power/ground ring, formed in a second conductive layer overlying the first passivation layer, for distributing power signal or ground signal, wherein the second conductive layer comprise aluminum; and a second passivation layer covering the second conductive layer and the first passivation layer.

From another aspect of this invention, an integrated circuit chip includes a semiconductor substrate having thereon a plurality of inter-metal dielectric (IMD) layers and a plurality of first conductive layers embedded in respective IMD layers, wherein the first conductive layers comprise copper; a first insulating layer overlying the plurality of IMD layers and the plurality of first conductive layers; a plurality of first power/ground mesh wiring lines, formed in a second conductive layer overlying the first insulating layer, for distributing power signal or ground signal, wherein the second conductive layer comprise aluminum; and a second insulating layer covering the second conductive layer and the first insulating layer.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DETAILED DESCRIPTION

The invention pertains to a novel power and ground routing capable of improving the performance of the integrated circuit chip. The invention utilizes a layer of aluminum in a passivation layer of the integrated circuit chip to form the power or ground ring and/or mesh interconnection network instead of the copper metal layer (Mn−1) that is just one level lower than the topmost copper metal layer (Mn) of the integrated circuit chip. Therefore, one of the topmost two levels of the copper metal layers that used to be formed into power and ground rings and mesh interconnection network can thus be eliminated or be spared for signal routing. Alternatively, the replaced Mn−1 copper layer can be skipped for saving photomask and cost. The invention can increase signal routing source and increase the flexibility of placement and routing.

The preferred embodiments of this invention will now be explained with the accompanying figures. Throughout the specification and drawings, the symbol "Mn" refers to the topmost level of the copper metal layers fabricated in the integrated circuit chip, while "Mn−1" refers to the copper metal layer that is just one level lower than the topmost copper metal layer and so on, wherein, preferably, n ranges between 5 and 8 but not limited thereto. The symbol "V" refers to the via plug between two adjacent conductive metal layers. For example, V5 refers to the via plug interconnecting M5 to M6.

Figure 1:
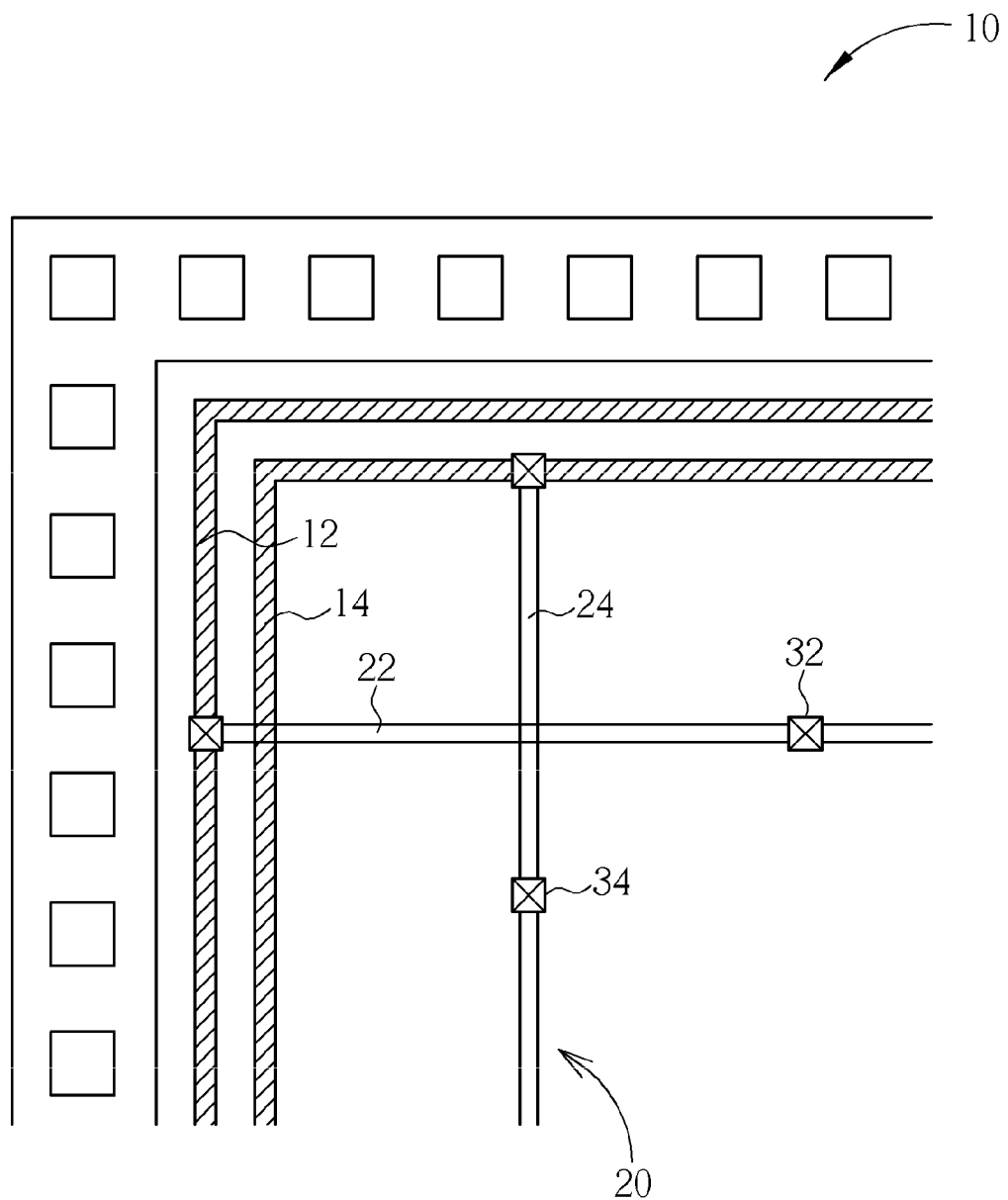
FIG. 1 is an enlarged top view of a conventional integrated circuit chip device with six levels of copper metal layers.
Figure 2:
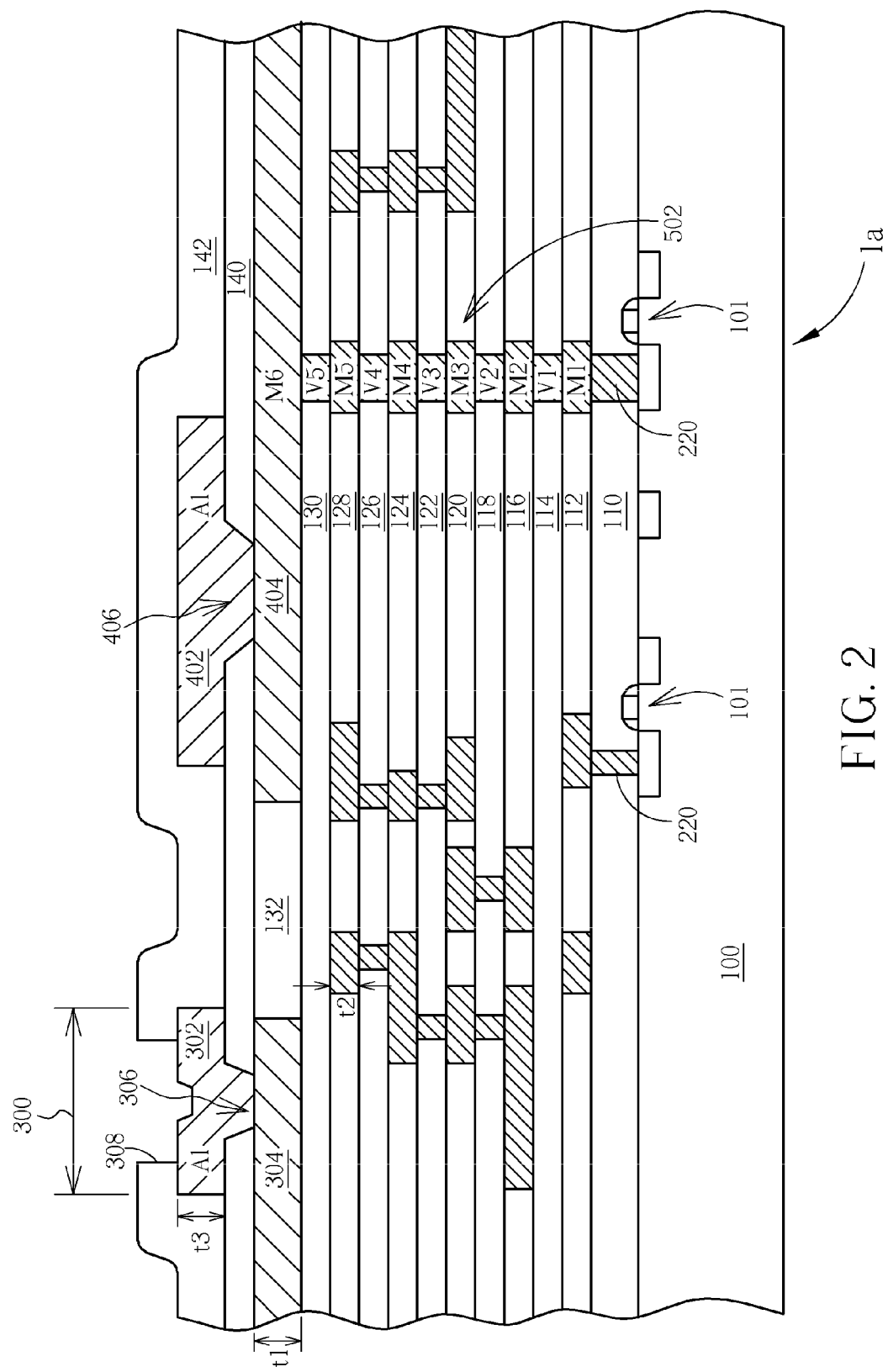
FIG. 2 is a schematic, cross-sectional diagram illustrating a germane portion of the exemplary integrated circuit chip that is fabricated with six levels of copper metal layers in accordance with one preferred embodiment of this invention.

FIG. 2 is a schematic, cross-sectional diagram illustrating a germane portion of the exemplary integrated circuit chip 1a that is fabricated with six levels of copper metal layers (M1-M6) in accordance with one preferred embodiment of this invention. As shown in FIG. 2, the exemplary integrated circuit chip 1a includes a semiconductor substrate 100 such as a silicon substrate, a silicon-on-insulator (SOI) substrate, SiGe substrate or the like. A plurality of inter-metal dielectric (IMD) layers 110-132 are deposited over the semiconductor substrate 100. Circuit elements 101 such as transistors, capacitors or memory cells are fabricated on the main surface of the semiconductor substrate 100. The IMD layers 110-132 may be formed of low dielectric constant (low-k) materials or ultra low-k materials, but not limited thereto. The IMD layers 110-132 may comprise conventional dielectric layer such as silicon oxide, silicon nitride, silicon carbide or silicon oxynitride. The low-k or ultra low-k materials described herein may be either organic (e.g., SILK) or inorganic (e.g., HSQ) and may be of a porous or non-porous nature.

According to this invention, M1-M6 and respective vias V1~V5 are fabricated using copper damascene processes or dual damascene processes, which are well known in the art and are thus not discussed further. The first level of the copper metal layers, i.e., M1 is fabricated in the IMD layer 112. A contact plug 220, typically tungsten plug, is formed in the IMD layer 110 to interconnect M1 to the circuit elements 101. The second level of the copper metal layers, i.e., M2 is fabricated in the IMD layer 116. A via plug V1, typically damascened copper plug integrated with M2, is formed in the IMD layer 114 to interconnect M1 to M2. The third level of the copper metal layers, i.e., M3 is fabricated in the IMD layer 120. A via plug V2 is formed in the IMD layer 118 to interconnect M2 to M3. The fourth level of the copper metal layers, i.e., M4 is fabricated in the IMD layer 124. A via plug V3 is formed in the IMD layer 122 to interconnect M3 to M4. The fifth level of the copper metal layers, i.e., M5 is fabricated in the IMD layer 124. A via plug V4 is formed in the IMD layer 122 to interconnect M4 to M5. The topmost level of the copper metal layers, i.e., M6 is fabricated in the IMD layer 132. A via plug V5 is formed in the IMD layer 130 to interconnect M5 to M6.

A first passivation layer 140 is deposited on the IMD layer 132 and covers the exposed M6 layer. The first passivation layer 140 may comprise silicon oxide, silicon nitride, polyimide or other suitable materials.

The integrated circuit chip 1a further comprises a bonding area 300. An aluminum pad 302 is formed on the first passivation layer 140 within the bonding area 300. The aluminum pad 302 is electrically connected with the underlying copper pad 304 that is formed in M6 layer through via 306. This aluminum pad 302 prevents oxidation of the underlying copper pad 304. The aluminum pad 302 may be part of a power or ground ring surrounding a circuit block of the integrated circuit chip 1a.

The aluminum pad 302 is covered with a second passivation layer 142. The second passivation layer 142 may comprise silicon oxide, silicon nitride, polyimide or other suitable materials. An opening or window 308 is provided in the second passivation layer 142 to expose a portion of the top surface of the aluminum pad 302. The opening 308 may be formed by conventional lithographic and etching methods.

The integrated circuit chip 1a depicted in FIG. 2 is fabricated based on a so-called 1P6M scheme (one polysilicon layer and six copper metal layers). However, this invention is also applicable to other interconnection schemes such as 1P3M, 1P4M, 1P5M, 1P7M or 1P8M etc.

As previously described, the topmost level of the copper metal layers, i.e., M6 is much thicker than M5, and thus M5 has a higher sheet resistance (Rs). For example, M6 has a thickness t1 of about 0.85 micrometers (line width=0.36 micrometers; Rs=0.0212 Ω/cm2), and M5 has a thickness t2 of about 0.29 micrometers (line width=0.18 micrometers; Rs=0.0779 Ω/cm2).

Still referring to FIG. 2, the integrated circuit chip 1a further comprises a power or ground ring 402 that is formed in the aluminum layer over the first passivation layer 140. The aluminum pad 302 and the aluminum power or ground ring 402 can be formed concurrently. The thickness t3 of the aluminum power or ground ring 402 is ordinarily about 1.45 micrometers, which is much thicker than M6 layer. Preferably, to efficiently distributing power, it is recommended that the line width (L) of the power or ground ring 402 is about 3.0 micrometers with a spacing (S) of about 2.0 micrometers (L/S=3/2). The line width of the aluminum power or ground ring 402 may range between 3 micrometers and 30 micrometers.

Since the aluminum power or ground ring 402 is thick, the sheet resistance of the aluminum power or ground ring 402 can be as low as about 0.0212 Ω/cm2 which is close to M6 layer. The aluminum power or ground ring 402 may be electrically connected to the underlying copper trace line 404 through via 406. According to the preferred embodiment of this invention, the via 406 preferably has a dimension of 3 micrometers or 3-micrometer×3-micrometer to efficiently distributing power. The copper trace line 404 is formed in M6 layer and may function as part of the mesh interconnection network (not explicitly shown) for distributing power or ground signals to a circuit element 101 by way of, for example, the via stack 502.

The mesh interconnection network, as previously mentioned, includes a plurality of orthogonal horizontal trace lines and longitudinal trace lines across the circuit block. According to the preferred embodiment, the aluminum layer over the passivation layer 140 may be utilized to define either the horizontal trace lines or longitudinal trace lines of the mesh interconnection network.

It is one kernel feature of this invention that the power or ground rings for distributing power or ground signals to a circuit block of the integrated circuit chip 1a are formed merely in the topmost level of the copper metal layers and in the aluminum layer over the passivation layer 140. The aluminum layer over the passivation layer 140 is not only utilized to be a RDL for flip-chip or bump applications, but also is further utilized to form the power or ground signal routing. By doing this, M5 layer can be eliminated or be spared for flexible signal routing. The sheet resistance of the Al layer over the passivation 140 is much lower than M5 layer; thereby the IR drop is reduced.

Figure 3:
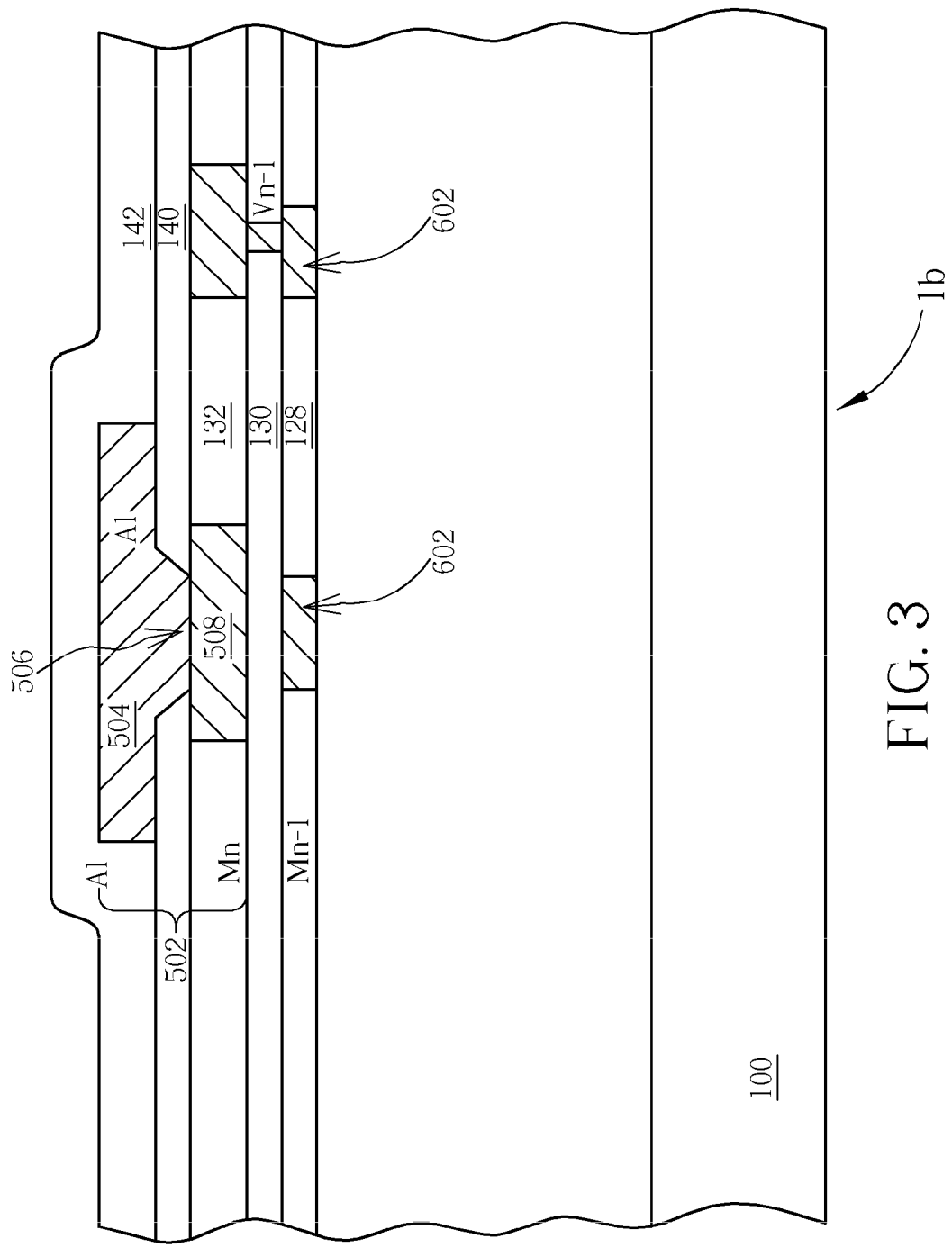
FIG. 3 is a schematic, cross-sectional diagram illustrating the second preferred embodiment of the invention.

FIG. 3 is a schematic, cross-sectional diagram illustrating the second preferred embodiment of the invention, wherein the same numerals designate like elements, layers or regions with the similar material and function. As shown in FIG. 3, likewise, the integrated circuit chip 1b comprises a semiconductor substrate 100. Circuit elements (not explicitly shown in FIG. 3) such as transistors, capacitors or memory cells are formed on the semiconductor substrate 100. A number of inter-metal dielectric (IMD) layers are deposited over the semiconductor substrate 100. For the sake of simplicity, only IMD layers 128-132 are shown. A first passivation layer 140 is deposited on the IMD layer 132 and covers the exposed Mn layer.

The integrated circuit chip 1b comprises n layers of copper metal interconnection (M1-Mn) and respective vias ($V_1$-$V_{n-1}$) which are fabricated using copper damascene processes or dual damascene processes, which are well known in the art and are thus not discussed further. A power/ground ring 502 is formed in combination with the Al layer and the Mn layer. A power/ground ring 602 is formed in the Mn-1 layer. The IR drop is reduced by parallel connecting the Al layer 504 with the underlying Mn layer 508 through the Al via 506. By doing this, the sheet resistance of the power/ground ring 502 is decreased.

Figure 4:
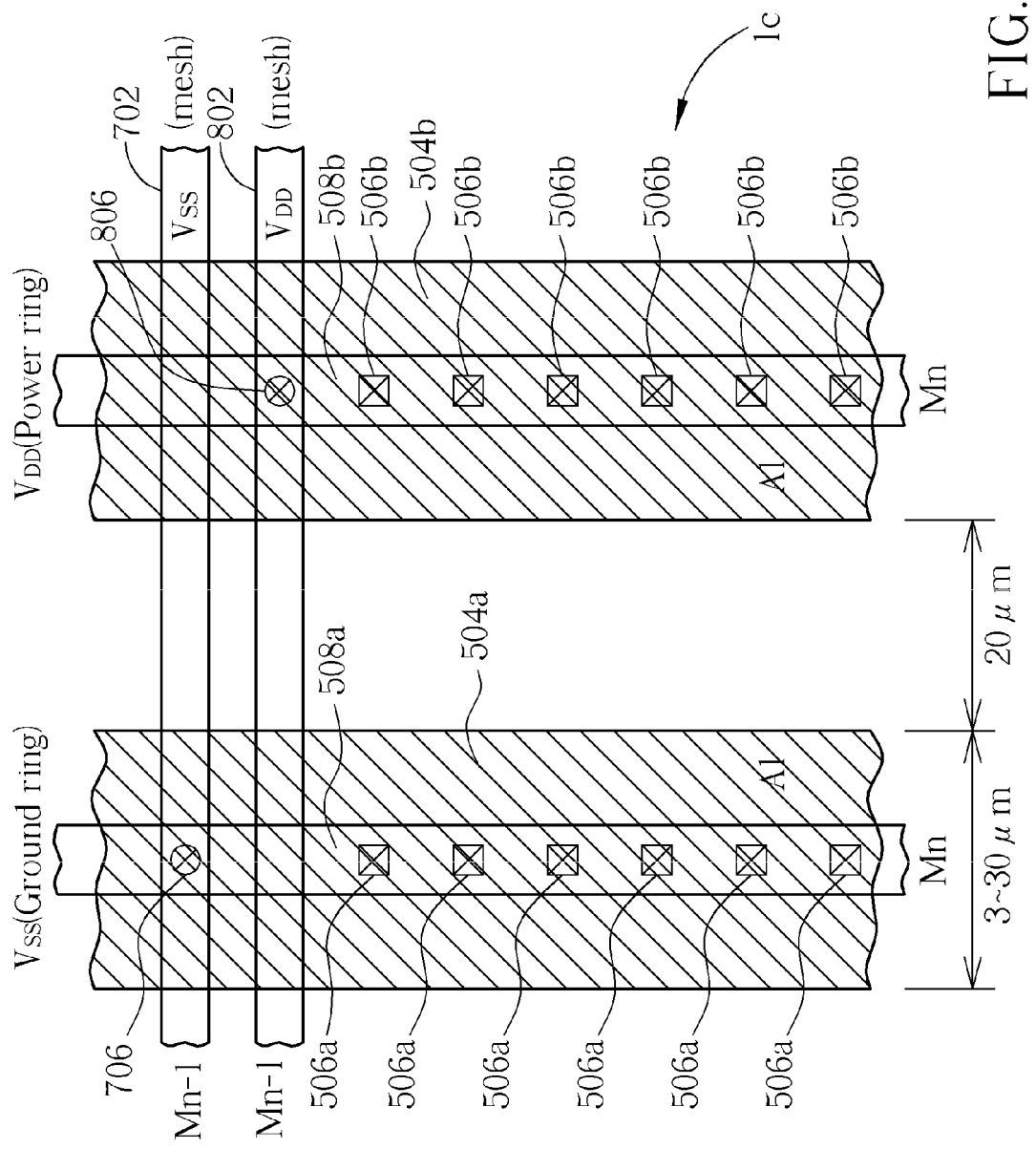
FIG. 4 is a schematic diagram showing the layout in accordance with the second preferred embodiment of this invention.

FIG. 4 is a schematic diagram showing the layout in accordance with the second preferred embodiment of this invention, wherein the same numerals designate like elements, layers or regions with similar material and function. As shown in FIG. 4, an integrated circuit chip 1c comprises a ground ring 508a for distributing $V_{SS}$ signal and a power ring 508b for distributing $V_{DD}$ signal. The parallel ground ring 508a and the power ring 508b are both formed in the Mn layer, i.e., the topmost copper metal layer of the integrated circuit chip 1c.

Two exemplary tracing lines 702 and 802 of a mesh interconnection network, which are orthogonal to the ground ring 508a and the power ring 508b, are formed in the Mn-1 layer. The orthogonal tracing line 702 is electrically connected to the overlying ground ring 508a through via 706, which is formed between Mn-1 layer and Mn layer. The orthogonal tracing line 802 is electrically connected to the overlying power ring 508b through via 806, which is formed between Mn-1 layer and Mn layer.

Aluminum wiring lines 504a is deposed right above and parallel to ground ring 508a; and aluminum wiring lines 504a is connected to ground ring 508a through via 506a. Aluminum wiring lines 504b is deposed right above and parallel to power ring 508b; and aluminum wiring lines 504b is connected to power ring 508b through via 506b. Preferably, the line width of the aluminum wiring lines 504a and 504b ranges between 3 micrometers and 30 micrometers with a spacing of about 20 micrometers. Preferably, the vias 506a and 506b have a dimension of 3-micrometer×3-micrometer, and the spacing between two adjacent vias 506a is about 3 micrometers. A first passivation layer (not explicitly shown in FIG. 4) is interposed between the aluminum wiring lines and the power/ground ring. A second passivation layer such as silicon nitride or polyimide covers the aluminum wiring lines 504a and 504b and the first passivation layer.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An integrated circuit chip comprising:
   a semiconductor substrate having thereon a plurality of inter-metal dielectric (IMD) layers and a plurality of first conductive layers embedded in respective said plurality of IMD layers, wherein said first conductive layers comprise copper;

a first insulating layer overlying said plurality of IMD layers and said plurality of first conductive layers;

a plurality of first power/ground mesh wiring lines, formed in a second conductive layer overlying said first insulating layer, for distributing power signal or ground signal, wherein said second conductive layer comprise aluminum; and a second insulating layer covering said second conductive layer and said first insulating layer.

2. The integrated circuit chip of claim 1 further comprising:

a plurality of second power/ground mesh wiring lines, formed in a topmost layer of said plurality of first conductive layers, for distributing power signal or ground signal;

wherein said second power/ground mesh wiring lines comprise a plurality of horizontal trace lines or longitudinal trace lines.

3. The integrated circuit chip of claim 2 wherein each said plurality of first power/ground mesh wring line has a thickness that is greater than that of each of said second power/ground mesh wiring line.

4. The integrated circuit chip of claim 1 wherein said first power/ground mesh wiring lines comprise a plurality of horizontal trace lines or longitudinal trace lines.

5. The integrated circuit chip of claim 1 further comprising:

a first power/ground ring formed in said second conductive layer.

6. The integrated circuit chip of claim 1, wherein further comprising:

a second power/ground ring formed in a topmost layer of said plurality of first conductive layers.

7. The integrated circuit chip of claim 1, wherein the first insulating layer comprises different material from that of the IMD layers.

8. The integrated circuit chip of claim 1, wherein the second insulating layer comprises different material from that of the IMD layers.

9. The integrated circuit chip of claim 1, wherein the second insulating layer is a passivation layer.

* * * * *